United States Patent
Li et al.

(10) Patent No.: US 12,526,993 B2
(45) Date of Patent: Jan. 13, 2026

(54) METHODS FOR FABRICATING A LAYERED SEMICONDUCTOR STRUCTURE FOR NAND MEMORY DEVICES

(71) Applicant: Yangtze Memory Technologies Co., Ltd., Hubei (CN)

(72) Inventors: Qian Li, Hubei (CN); Shu Wu, Hubei (CN); Liang Xiao, Hubei (CN); Lei Li, Hubei (CN); Hao Pu, Hubei (CN)

(73) Assignee: Yangtze Memory Technlogies Co., Ltd., Wuhan (CN)

( * ) Notice: Subject to any disclaimer, the term of this patent is extended or adjusted under 35 U.S.C. 154(b) by 703 days.

(21) Appl. No.: 17/889,216

(22) Filed: Aug. 16, 2022

(65) Prior Publication Data

US 2024/0064977 A1    Feb. 22, 2024

(51) Int. Cl.
| | |
|---|---|
| *H10B 43/27* | (2023.01) |
| *G11C 16/04* | (2006.01) |
| *H10B 41/27* | (2023.01) |
| *H10B 41/35* | (2023.01) |
| *H10B 43/35* | (2023.01) |

(52) U.S. Cl.
CPC ......... *H10B 43/27* (2023.02); *G11C 16/0483* (2013.01); *H10B 41/27* (2023.02); *H10B 41/35* (2023.02); *H10B 43/35* (2023.02)

(58) Field of Classification Search
CPC ........ H10B 43/27; H10B 41/27; H10B 41/35; H10B 43/35; G11C 16/0483
See application file for complete search history.

(56) References Cited

U.S. PATENT DOCUMENTS

| | | | | |
|---|---|---|---|---|
| 7,863,671 | B2* | 1/2011 | Kim | H10B 41/35 257/315 |
| 9,000,509 | B2* | 4/2015 | Lee | H10B 43/27 257/314 |
| 9,728,551 | B1* | 8/2017 | Lu | H01L 21/3003 |
| 10,811,411 | B1* | 10/2020 | Shu | H10D 30/024 |
| 11,127,461 | B2* | 9/2021 | Harari | H10D 30/694 |
| 2006/0091481 | A1* | 5/2006 | Li | H10D 30/6757 257/E29.05 |
| 2010/0327323 | A1* | 12/2010 | Choi | G11C 16/0483 257/E27.103 |

(Continued)

FOREIGN PATENT DOCUMENTS

| | | | | | |
|---|---|---|---|---|---|
| CN | 111293123 | A | * | 6/2020 | H10B 43/35 |
| CN | 112310091 | A | * | 2/2021 | H10D 30/69 |
| CN | 112951839 | A | * | 6/2021 | H10B 41/35 |

*Primary Examiner* — Mohammed Shamsuzzaman
(74) *Attorney, Agent, or Firm* — HANLEY, FLIGHT & ZIMMERMAN, LLC

(57) ABSTRACT

The present disclosure provides a fabrication method to produce a semiconductor structure with increased reliability for use in NAND memory devices. The method can include forming a layered semiconductor structure that includes a first layer, a second layer disposed on the first layer, and a third layer disposed on the second layer. The method can also include forming a channel structure, which can include etching the first layer, the second layer, and the third layer to form an opening through a surface of the semiconductor structure. A portion of the third layer can be exposed at the opening. The forming of the channel structure also include oxidizing the exposed portion of the third layer to form silicon oxide expand the exposed portion of the third layer.

17 Claims, 15 Drawing Sheets

(56) References Cited

U.S. PATENT DOCUMENTS

| | | | | |
|---|---|---|---|---|
| 2012/0146127 | A1* | 6/2012 | Lee | H10D 30/0413 |
| | | | | 257/E21.423 |
| 2012/0211822 | A1* | 8/2012 | Lim | H10B 41/20 |
| | | | | 257/324 |
| 2015/0137209 | A1* | 5/2015 | Lee | H10B 43/27 |
| | | | | 438/269 |
| 2019/0043960 | A1* | 2/2019 | Koval | H10D 30/6891 |
| 2021/0288070 | A1* | 9/2021 | Choi | H10D 64/685 |
| 2021/0391348 | A1* | 12/2021 | Han | H01L 21/76816 |
| 2021/0391353 | A1* | 12/2021 | Zhao | H10B 43/27 |
| 2022/0028880 | A1* | 1/2022 | Shirota | H10B 43/10 |
| 2022/0045101 | A1* | 2/2022 | Yun | H10D 84/038 |
| 2022/0149053 | A1* | 5/2022 | Lee | H10B 43/27 |

* cited by examiner

METHODS FOR FABRICATING A LAYERED SEMICONDUCTOR STRUCTURE FOR NAND MEMORY DEVICES

TECHNICAL FIELD

The present disclosure generally relates to the field of semiconductor technology, and more particularly, to a method for debugging double program errors in NAND memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to aggressive scaling, reliability can be a concern for a 3D NAND flash memory.

BRIEF SUMMARY

Embodiments of methods and systems for data protection in a memory device are described in the present disclosure.

In some embodiments, a fabrication method can produce a semiconductor structure with increased reliability for use in NAND memory devices. The method can include forming a semiconductor structure that includes a first layer, a second layer disposed on the first layer, and a third layer disposed on the second layer. The method can also include forming a channel structure, which can include etching the first layer, the second layer, and the polysilicon layer to form an opening through a surface of the semiconductor structure. A portion of the third layer can be exposed at the opening. The forming of the channel structure can also include oxidizing the exposed portion of the third layer to form silicon oxide to expand the exposed portion of the third layer based on the oxidizing.

In some embodiments, the oxidizing can include using a wet oxidation process.

In some embodiments, the expanding of the exposed portion of the polysilicon layer can narrow a portion of the opening.

In some embodiments, the method can also include disposing a first channel layer at the opening. The method can also include disposing a second channel layer within the opening and on the first channel layer. The second channel layer can have the second silicon compound. The method can also include disposing a third channel layer within the opening and on the second channel layer.

In some embodiments, the expanding of the exposed portion of the third layer can narrow a portion of the opening. The disposing of the first, second, or third channel layers can obstruct the narrowed portion of the channel.

In some embodiments, the method can also include disposing fourth and fifth channel layers within the channel structure.

In some embodiments, the method can also include forming a channel end structure. The forming can include disposing a first channel layer at the opening. The forming can also include disposing a second channel layer at the opening and on the first channel layer. The forming can also include disposing a third channel layer at the opening and on the second channel layer. The channel end structure can include a bottleneck cross-section based on the expanded exposed portion of the third layer.

In some embodiments, the forming of the semiconductor structure can include forming a layer of silicon oxide for the first layer.

In some embodiments, the forming of the semiconductor structure can include forming a layer of silicon nitride for the second layer.

In some embodiments, the oxidizing can include performing a wet oxidation process using gasses having a temperature greater than approximately 600 degrees Celsius and less than approximately 800 degrees Celsius.

In some embodiments, the oxidizing can include exposing the exposed portion of the polysilicon layer to hydrogen gas and oxygen gas.

In some embodiments, a ratio of the hydrogen gas to the oxygen gas can be greater than approximately 0.14 and less than approximately 7.00.

In some embodiments, the oxidizing can also include performing the exposing of the exposed portion of the polysilicon layer to the hydrogen and oxygen gasses for a duration greater than approximately 0.5 hours and less than approximately 12.0 hours.

In some embodiments, the oxidizing can include exposing the exposed portion of the third layer to nitrogen gas.

In some embodiments, the semiconductor structure can include a sacrificial layer affixed to at least the first layer. The etching can also include etching the sacrificial layer.

In some embodiments, the method can also include disposing a first channel layer at the opening of the channel structure. A portion of the first channel layer can be disposed in an etched portion of the sacrificial layer.

In some embodiments, the method can also include bonding the semiconductor structure to a CMOS structure. The sacrificial layer can be disposed opposite from a bonding interface of the semiconductor structure and the CMOS structure.

In some embodiments, a fabrication method can produce a semiconductor structure with increased reliability for use in NAND memory devices. The method can include fabricating the semiconductor structure to include a sacrificial layer, a first layer, a second layer, a third layer, and a channel structure disposed intersecting at least the first, second, third, and sacrificial layers. The channel structure can include a void and a narrowed portion. The method can also include removing the sacrificial layer. The removing of the sacrificial structure can include removing a portion of the channel structure disposed intersecting the sacrificial layer. The method can also include removing the first layer to expose the third layer and the narrowed portion of the channel structure. The material produced by the removing of the sacrificial layer is prevented from entering the void of the channel structure based on the narrowed portion obstructing access to the void.

In some embodiments, the method can also include etching portions of the first and second layers disposed proximal to narrowed portion of the channel structure.

In some embodiments, the method can also include disposing polysilicon on the semiconductor structure to form a contact to a polysilicon structure of the channel structure.

In some embodiments, the removing of the sacrificial layer can also include using a chemical mechanical polishing process.

In some embodiments, the removing of the first layer can include using a chemical mechanical polishing process.

In some embodiments, a semiconductor structure is provided having increased reliability for use in NAND memory devices. The layered semiconductor can include a polysilicon layer, a silicon oxide layer, a silicon nitride layer, and a channel structure. The channel structure can have a length that is disposed intersecting at least the polysilicon, silicon oxide, and silicon nitride layers. The channel structure can include a wide portion having a width defined perpendicular to the length of the channel. The wide portion can be disposed intersecting at least the silicon nitride layer. The channel structure can also include a narrow portion having a width defined perpendicular to the length of the channel. The narrow portion can be disposed intersecting at least the polysilicon layer. The width of the narrow portion can be smaller than the width of the wide portion.

In some embodiments, a NAND flash memory device is provided having a layered semiconductor structure that increases reliability. The NAND flash memory device can include a semiconductor structure. The semiconductor can include a polysilicon layer, a silicon oxide layer, a silicon nitride layer, and a channel structure. The channel structure can have a length that is disposed to intersect at least the polysilicon, silicon oxide, and silicon nitride layers. The channel structure can include a wide portion having a width defined perpendicular to the length of the channel. The wide portion can be disposed intersecting at least the silicon nitride layer. The channel structure can also include a narrow portion having a width defined perpendicular to the length of the channel. The narrow portion can be disposed intersecting at least the polysilicon layer. The width of the narrow portion can be smaller than the width of the wide portion.

In some embodiments, a memory system is provided having a layered semiconductor structure that increases reliability. The memory system can include a NAND flash memory device. The NAND flash memory device can include a semiconductor structure. The semiconductor can include a polysilicon layer, a silicon oxide layer, a silicon nitride layer, and a channel structure. The channel structure can have a length that is disposed to intersect at least the polysilicon, silicon oxide, and silicon nitride layers. The channel structure can include a wide portion having a width defined perpendicular to the length of the channel. The wide portion can be disposed intersecting at least the silicon nitride layer. The channel structure can also include a narrow portion having a width defined perpendicular to the length of the channel. The narrow portion can be disposed intersecting at least the polysilicon layer. The width of the narrow portion can be smaller than the width of the wide portion.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
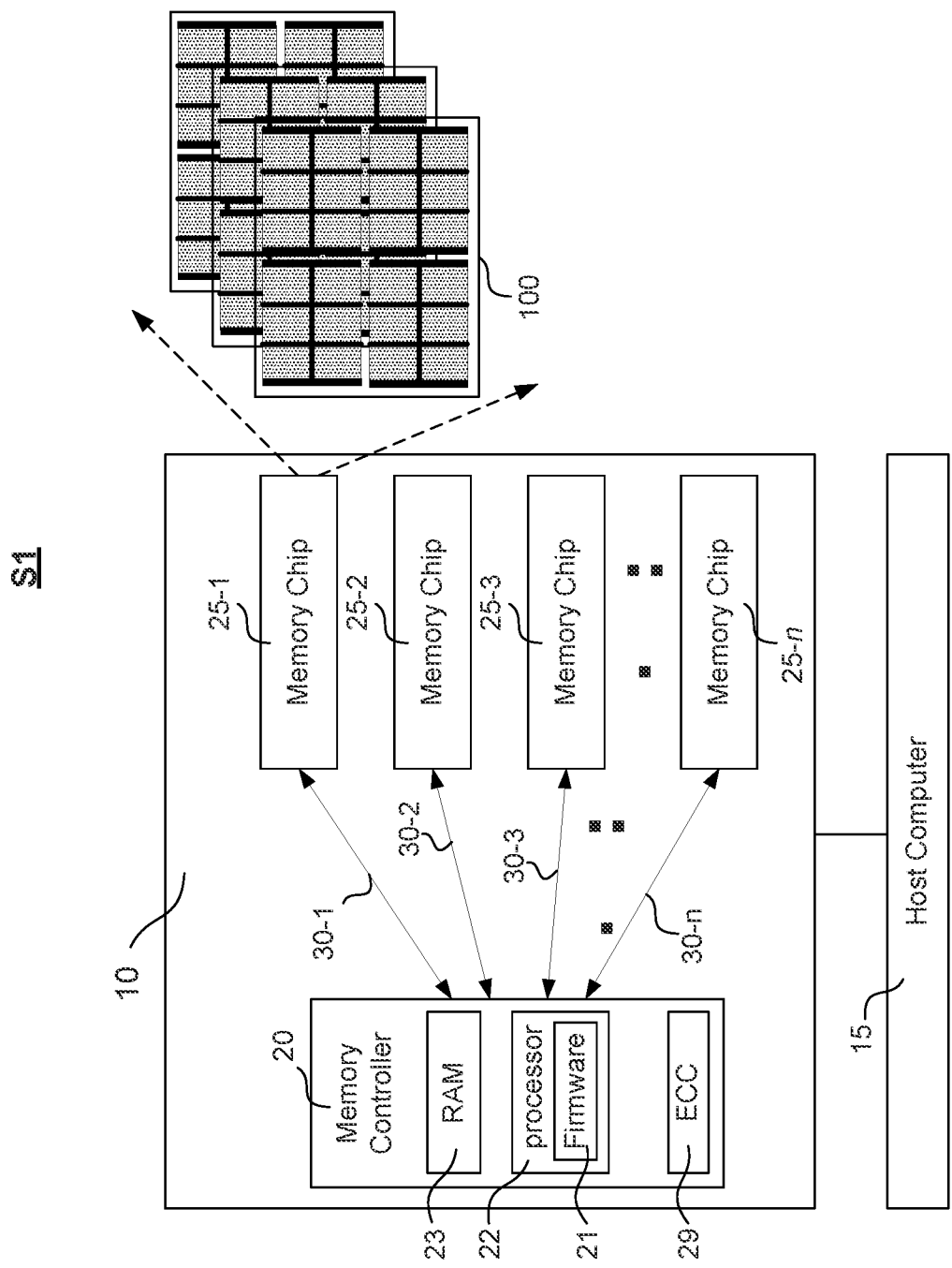
FIGS. 1 and 2A-2B illustrate a storage system with one or more memory chips, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about," "approximately," or the like, indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of a system Si having a storage system 10, according to some embodiments. In some embodiments, system Si can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Storage system 10 (e.g., a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (e.g., "flash," "NAND flash" or "NAND"). Storage system 10 can communicate with a host computer 15 through memory controller 20, where memory controller 20 can be connected to one or more memory chips 25-1, 25-2, 25-3, . . . , 25-n, via one or more memory channels 30-1, 30-2, 30-3, . . . , 30-n. In some embodiments, each memory chip 25 can be managed by memory controller 20 via one or more memory channels 30-1, 30-2, 30-3, . . . , 30-n.

In some embodiments, host computer 15 can include a processor of an electronic device, such as a central processing unit (CPU), or a system-on-chip (SoC), such as an application processor (AP). Host computer 15 can send data to be stored at storage system 10 and/or can retrieve data from stored in storage system 10.

In some embodiments, memory controller 20 can handle I/O requests received from host computer 15, ensure data integrity and efficient storage, and manage memory chip 25. To perform these tasks, Memory controller 20 may run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory chip 25 (e.g., actual locations where the data is stored). Controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

In some embodiments, the memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2A:
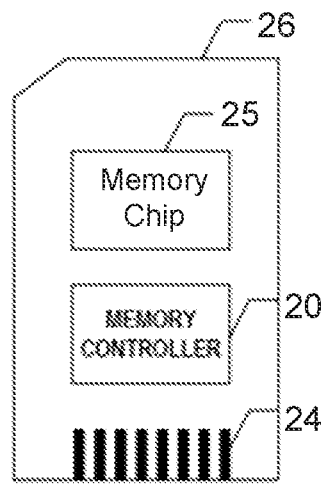
Figure 2B:
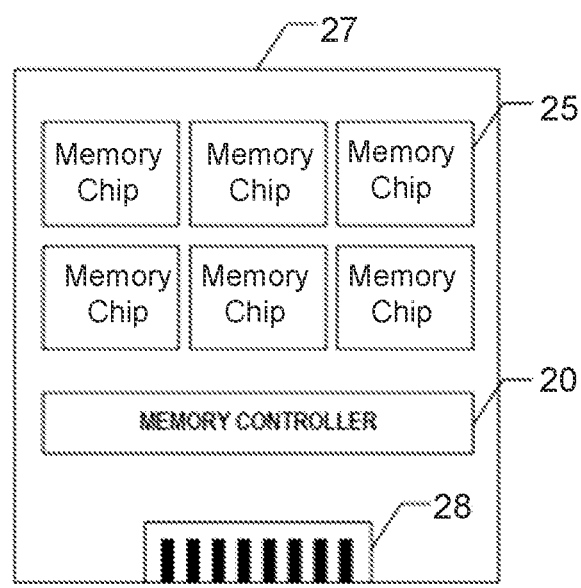

In some embodiments, memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, mini SD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory chip 25 can be integrated into an solid state drive (SSD) 27. SSD 27 can further include an SSD connector 28 coupling SSD 27 with a host (e.g., the host computer 15 in FIG. 1).

Figure 3:
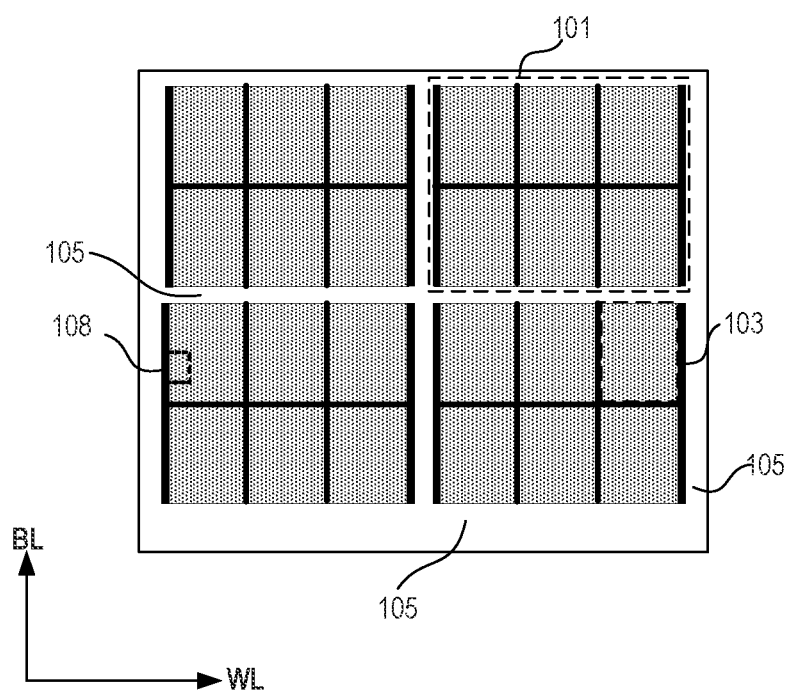
FIG. 3 illustrates a schematic diagram of a memory die, according to some embodiments.

FIG. 3 illustrates a top-down view of a memory die 100, according to some embodiments. The example configuration shown in FIG. 3 is given as a non-limiting example and it is to be appreciated that memory is scalable. In some embodiments, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

In some embodiments, memory die 100 can also include a periphery region 105, an area surrounding memory planes 101. The periphery region 105 can include many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc.

In some embodiments, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
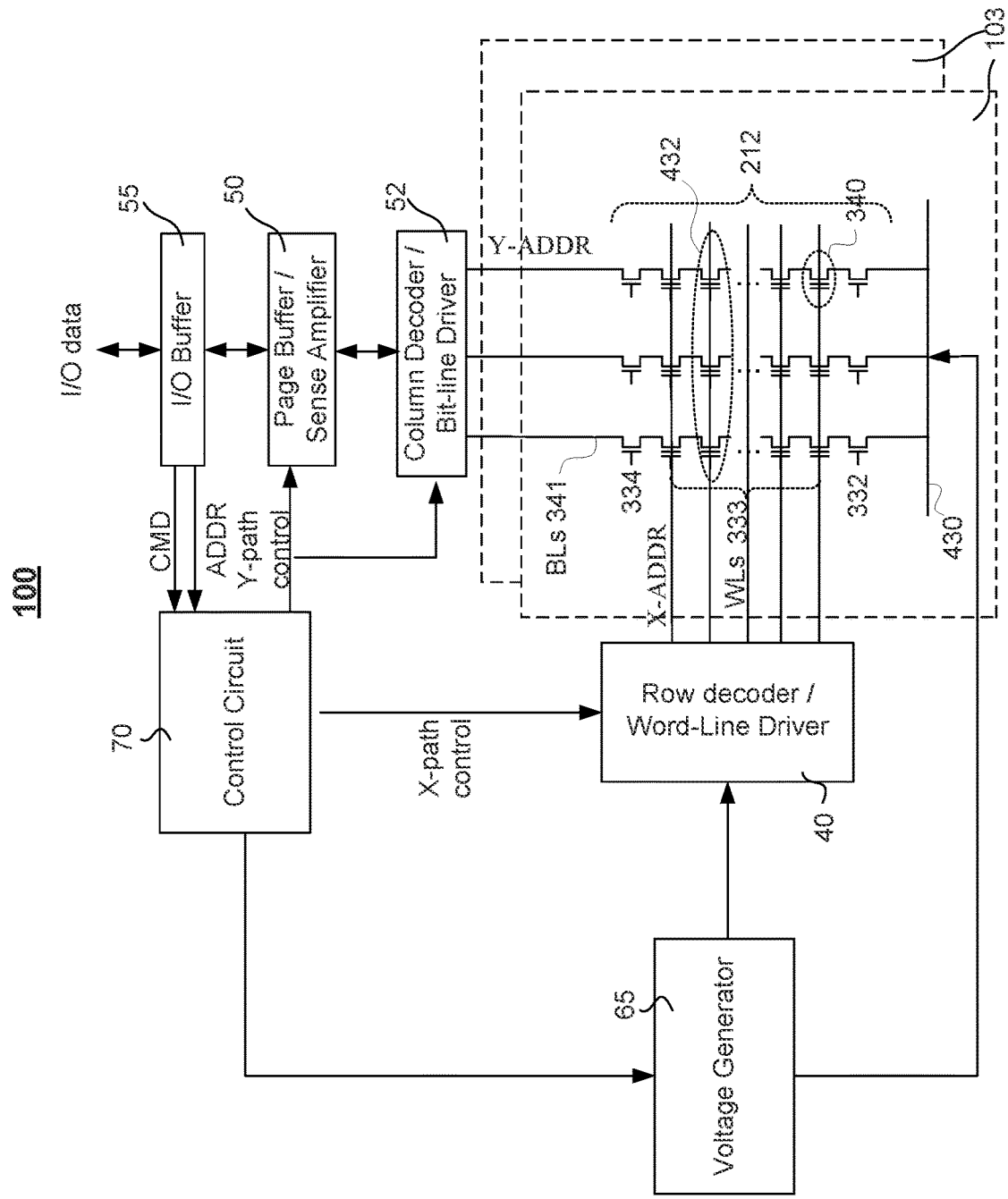
FIG. 4 illustrates a schematic of a three-dimensional (3D) memory die, according to some embodiments.

FIG. 4 illustrates a schematic diagram of the memory die 100, according to some embodiments. In some embodiments, memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate (LSG) 332 and a top select gate (TSG) 334, respectively. The drain terminal of the top select transistor 334-T can be connected to a bit line 341, and the source terminal of the lower select transistor 332-T can be connected to an array common source (ACS) 430. ACS 430 can be shared by the memory strings 212 in an entire memory block, and is also referred to as the common source line.

In some embodiments, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to a X-path control signal provided by the control circuit 70. Rrow decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

In some embodiments, column decoder/bit line driver 52 can transfer an inhibit voltage $V_{inhibit}$ to an unselected bit line and connect a selected bit line to ground according to a Y-path control signal received from control circuit 70. In the other words, column decoder/bit line driver 52 can be configured to select or unselect one or more memory strings 212 according to the Y-path control signal from control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some embodiments, input/output buffer 55 can transfer the I/O data from/to the page buffer/sense amplifier 50 as well as addresses ADDR or commands CMD to the control circuit 70. In some embodiments, input/output buffer 55 can function as an interface between memory controller 20 (in FIG. 1) and memory die 100 on memory chip 25.

In some embodiments, control circuit 70 can control page buffer/sense amplifier 50 and row decoder/word line driver 40 in response to the commands CMD transferred by the input/output buffer 55. During the program operation, control circuit 70 can control row decoder/word line driver 40 and page buffer/sense amplifier 50 to program a selected memory cell. During the read operation, control circuit 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some embodiments, voltage generator 65 can generate voltages to be supplied to word lines and bit lines under the control of control circuit 70. The voltages generated by voltage generator 65 include the read voltage $V_{read}$, the program voltage $V_{pgm}$, the pass voltage $V_{pass}$, the inhibit voltage $V_{inhibit}$, etc.

It is noted that the arrangement of the electronic components in the storage system 10 and the memory die 100 in FIGS. 1, 2A-2B, and 3-4 are shown as non-limiting examples. In some embodiments, storage system 10 and memory die 100 can have other layout and can include additional components. Components (e.g., control circuit 70, I/O buffer 55) on memory die 100 shown in FIG. 4 can also be moved off memory die 100, as a stand-alone electric component in the storage system 10. Components (e.g., control circuit 70, I/O buffer 55) on memory die 100 shown in FIG. 4 can also be moved to other components in storage system 10, for example, a portion of control circuit 70 can be combined with memory controller 20 and vice versa.

Figure 5:
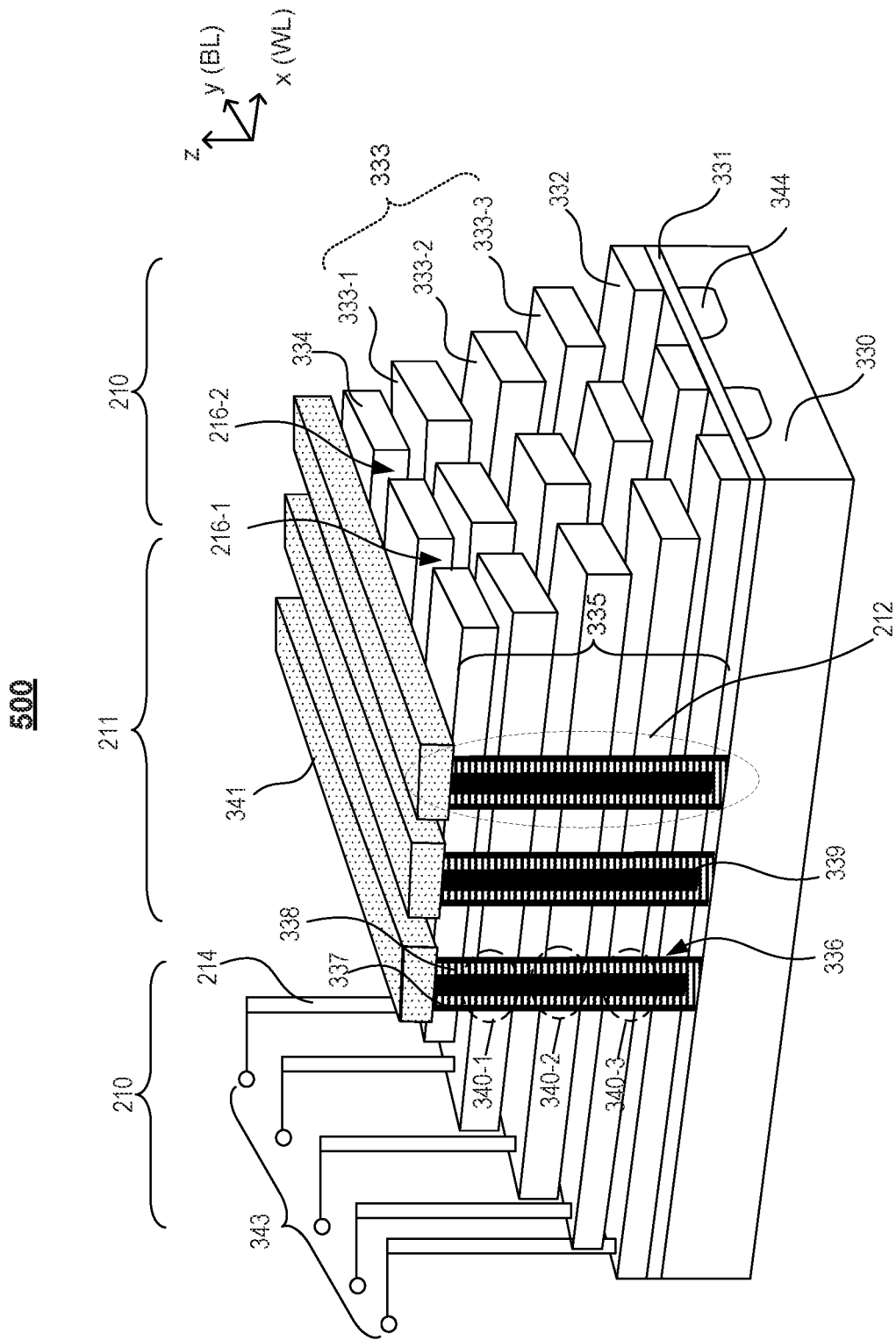
FIG. 5 illustrates a perspective view of a portion of a 3D memory structure, in accordance with some embodiments.

FIG. 5 illustrates a perspective view of a 3D memory structure 500, according to some embodiments. In some embodiments, memory die 100 can be a 3D NAND memory, and the 3D memory structure 500 can be a portion of memory die 100, for example, in a region 108 in FIG. 3. The 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some embodiments, the 3D memory structure 500 can include a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

In some embodiments, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In some embodiments, in a NAND flash memory, a read operation and a write operation (also referred to as program operation) can be performed for the memory page 432, and an erase operation can be performed for the memory block 103.

In some embodiments, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430.

At the erased state ER ("state ER"), the threshold voltage $V_{th}$ of memory cells 340 can be reset to the lowest value.

In some embodiments, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0").

In some embodiments, the state of the memory cell (e.g., state ER or state P1) can be determined by measuring or sensing the threshold voltage $V_{th}$ of the memory cell. During a read operation, a read voltage $V_{read}$ can be applied on control gate 333 of the memory cell and current flowing through the memory cell can be measured at bit line 341. A pass voltage $V_{pass}$ can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), logic {1 and 0}, i.e., states ER and P1. In the MLC mode, a memory cell stores 2 bits, and has four logic states, logic {11, 10, 01, and 00}, i.e., states ER, P1, P2, and P3. In the TLC mode, a memory cell stores 3 bits, and has eight logic states, logic {111, 110, 101, 100, 011, 010, 001, 000}, i.e., states ER, and states P1-P7. In the QLC mode, a memory cell stores 4 bits and has 16 logic states. Memory controller 20 of storage system 10 (see FIG. 1) can convert data received from host computer 15 into corresponding logic states of the memory cells on memory dies 100 and vice versa.

In some embodiments, fabrication of semiconductor structures, such as 3D NAND, can be subject to a number of fabrication errors, thereby reducing yield rates and increasing costs. It is desirable to reduce instances of fabrication error. In one example scenario, an error can result when fabricating a channel and sub-structures, such as channel hole 336. When channel hole 336 is etched into the semiconductor structure, subsequent fabrication processes can introduce contaminants into channel hole 336 (e.g., particles from a polishing process). Such imperfections can cause the affected channel(s) to exhibit non-conforming performance. If possible, the fabrication can be reattempted, but this introduces delays to the fabrication process, and success is not guaranteed. Another method of addressing a faulty structure is to flag it as permanently unusable (e.g., using the NAND memory controller), but this is unideal and reduces data capacity per volume of the device and sections of the final product are permanently unusable.

Embodiments disclosed herein provide semiconductor structures and fabrication methods to reduce instances of fabrication error.

FIGS. 6A, 6B, 6C and 6D illustrate a cross-section of a semiconductor structure 600 at various stages of fabrication, according to some embodiments. In some embodiments, semiconductor structure 600 can represent a portion of 3D memory structure 500 (FIG. 5). Separate features relating to the fabrication method are described with reference to FIGS. 6A, 6B, 6C and 6D. Semiconductor structure 600 can be a layered semiconductor structure. For example, semiconductor structure 600 can comprise a silicon compound layer 602 (e.g., a first layer), a silicon compound layer 604 (e.g., a second layer), and a polysilicon layer 606. Semiconductor structure 600 can also comprise a sacrificial layer 608 (e.g., a layer that is removed at a later time during fabrication) and a channel structure 610. Silicon compound layers 602 and 604 can comprise different silicon compounds. For example one layer can comprise silicon nitride and other can comprise silicon oxide.

It should be appreciated that, in some embodiments, enumerative adjectives (e.g., "first," "second," "third," or the like) may be used as a naming convention, and are not intended to indicate an order of introduction (unless otherwise noted). For example, the terms "a first layer" and "a second layer" may distinguish two layers, but need not specify which layer comes before the other during fabrication. Furthermore, an element in a drawing is not limited to any particular enumerative adjective. For example, silicon compound layer 602 can be referred to as a second layer if other layer(s) use appropriately distinguishing enumerative adjective(s).

Figure 6A:
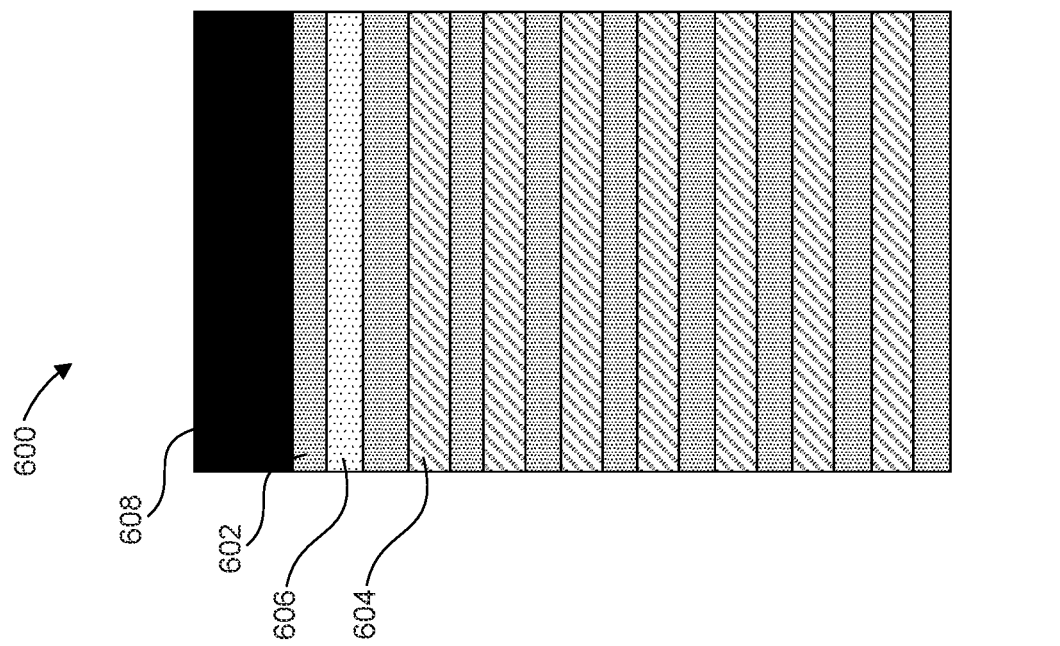
FIGS. 6A, 6B, 6C and 6D illustrate a cross-section of a semiconductor structure at various stages of fabrication, according to some embodiments.

In some embodiments, the different layers of semiconductor structure 600 can be fabricated using material disposing techniques on sacrificial layer 608. Some non-limiting examples of techniques can include chemical vapor deposition (CVD), physical vapor deposition (PVD), plasma-enhanced CVD (PECVD), low pressure chemical vapor deposition (LPCVD), high density plasma (HDP), atomic layer deposition (ALD), sputtering, thermal oxidation or nitridation, or combinations thereof. Disposing can also include growth methods such as epitaxial growth. Referring to FIG. 6A, a fabrication method can comprise providing a silicon wafer as sacrificial layer 608. The fabrication method can further comprise disposing silicon compound layer 602 onto sacrificial wafer 608. The fabrication method can further comprise disposing polysilicon layer 606 onto silicon compound layer 602 on sacrificial wafer 608. The fabrication method can further comprise disposing silicon compound layer 604 onto polysilicon layer 606. The fabrication method can comprise disposing additional alternating layers of silicon compound layers 602 and 604. Sacrificial layer 608 can provide structural support to the deposited layers. For example, at least silicon compound layer 602 can be affixed to sacrificial layer 608.

Figure 6B:
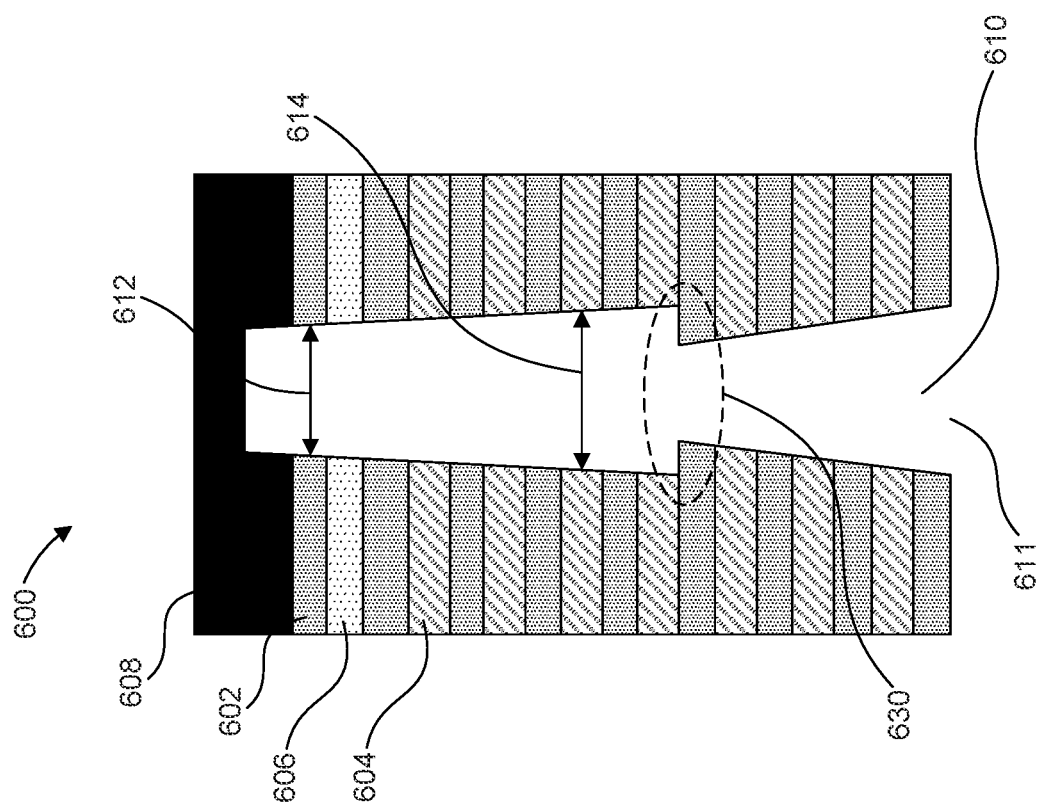

In some embodiments, the fabrication method can comprise performing a chemical etch of semiconductor structure 600 to form channel structure 610. FIG. 6B represents a state of semiconductor structure 600 directly after the chemical etch. The chemical etch can penetrate through the different layers such that channel structure 610 is disposed intersecting at least silicon compound layers 602 and 604, polysilicon layer 606, and sacrificial layer 608. That is, while compound layers 602 and 604, polysilicon layer 606, and sacrificial layer 608 are oriented horizontally on the page in FIG. 6B, a length of channel structure 610 can extend vertically on the page (in a direction that is perpendicular to the span of the layers). The chemical etch can be initiated on a side of semiconductor structure 600 opposite of sacrificial structure 608 such that the etch process can be stopped after a partial etch of sacrificial structure 608. Furthermore, a narrowed portion 630 can be formed during the etching process. Narrowed portion 630 is used for forming a connection between different parts of channel structure (e.g., connecting upper and lower channel).

In some embodiments, channel structure 610 can comprise an opening 611. The etching can expose portions of the different layers at the opening 611. An exposed region to consider is the exposed portion of polysilicon layer 606 at the sidewalls of channel structure 610, where a width 612 denotes the width of channel structure 610 at the exposed portion of polysilicon layer 606. Width 612 is measured parallel to the span of the layers—or perpendicular to the length of channel structure 610.

In some embodiments, another width of channel structure 610 is denoted by width 614. Width 614 can be defined at, for example, one of the additional alternating layers of silicon compound layers 602 and 604. In other words, width 614 can be defined at some location within channel 610 that is at a distance from polysilicon layer 606. Width 614 provides a comparison reference for width 612 as fabrication is progressed.

Figure 6C:
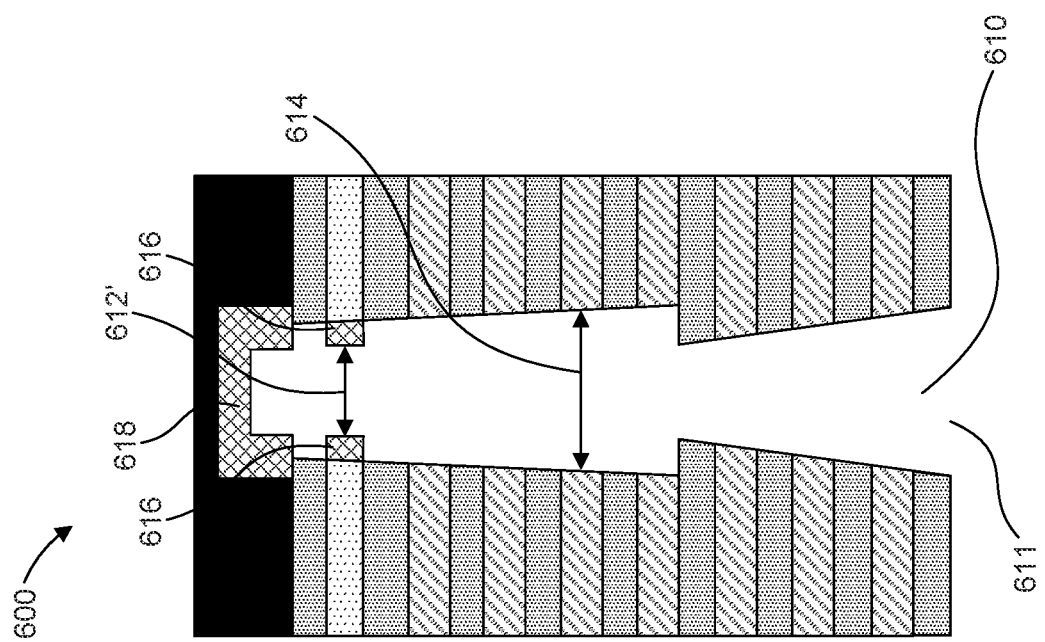

In some embodiments, the fabrication method can comprise oxidizing a portion of channel structure 610. FIG. 6C represents a state of semiconductor structure 600 directly after the oxidation process. The oxidizing can be performed using a wet oxidation process. Wet oxidation can use, for example, $H_2O$ molecules as the oxygen source to oxidize silicon. Wet oxidation can use other molecules as an oxidation source. The process is additive, which can cause mass and volume to increase at locations where oxygen is captured. The wet etch oxidation process can be selective. For example, wet oxidation conditions can be selected such that the pure silicon in polysilicon can be more susceptible to chemical reaction with oxygen while silicon nitride and silicon oxide are less susceptible. The wet etch process can be performed at a given ambient temperature, for a given length of time, and a given composition of gas.

In some embodiments, the oxidizing can comprise performing the wet oxidation process using gasses having a temperature greater than approximately 600 degrees Celsius (° C.) and less than approximately 800° C. In some embodiments, the oxidizing can comprise performing the wet oxidation process using gasses having a temperature greater than approximately 650° C. and less than approximately 750° C. It should be appreciated that the disclosed temperatures are provided as non-limiting examples and that other temperatures are envisaged based on other processing conditions.

In some embodiments, the oxidizing can comprise exposing the exposed portion of polysilicon layer 606 to hydrogen gas and oxygen gas. Nitrogen gas can also be present in the gas composition. A ratio of the hydrogen gas to the oxygen gas can be greater than approximately 0.14 (e.g., 1:7) and less than approximately 7.00 (e.g., 7:1). In some embodiments, a ratio of the hydrogen gas to the oxygen gas can be greater than approximately 0.50 and less than approximately 6.00. In some embodiments, a ratio of the hydrogen gas to the oxygen gas can be greater than approximately 1.50 and less than approximately 5.00. It should be appreciated that the disclosed ratios of gasses are provided as non-limiting examples and that other ratios are envisaged based on other processing conditions.

In some embodiments, the oxidizing can comprise performing the exposing of the exposed portion of polysilicon layer 606 to the hydrogen and oxygen gasses for a duration greater than approximately 0.5 hours and less than approximately 12.0 hours. In some embodiments, the oxidizing can comprise performing the exposing of the exposed portion of polysilicon layer 606 to the hydrogen and oxygen gasses for a duration greater than approximately 1.0 hour and less than approximately 10.0 hours. In some embodiments, the oxidizing can comprise performing the exposing of the exposed portion of polysilicon layer 606 to the hydrogen and oxygen gasses for a duration greater than approximately 2.0 hour and less than approximately 8.0 hours.

In some embodiments, the fabrication method can comprise expanding the exposed portion of polysilicon layer 606 based on the oxidizing (e.g., expanded portion 616). Expanded portion 616 can comprise oxidized silicon—that is, silicon oxide. Previously in FIG. 6B, the width at this portion of channel structure 610 was width 612. Now in FIG. 6C, the width has been reduced to width 612' due to the oxidation process and the resulting expansion of the exposed portion of polysilicon layer 606. In embodiments where sacrificial layer 608 is a silicon wafer, exposed portions of sacrificial layer 608 can also be susceptible to the wet oxidation process, allowing oxidized portion 618 to form. When using a wet etch process that is optimized for polysilicon reaction, it can be appreciated that width 614 at another layer (e.g., silicon nitride layer) in FIG. 6C remains approximately the same as it was in FIG. 6B. The selective nature the expansion of oxidized polysilicon is desirable for creating a bottleneck cross-section near the end of channel structure 610.

Figure 6D:
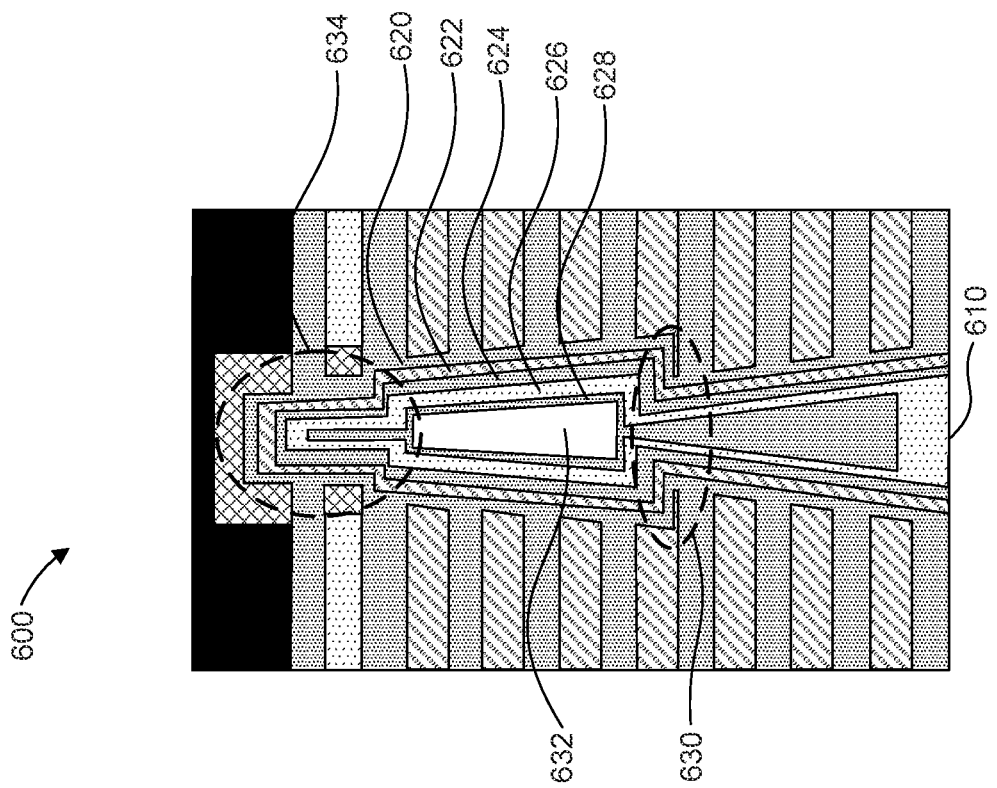

In some embodiments, the fabrication method can comprise disposing channel material in channel structure 610 to be used for communicating current electrical signals in a NAND memory device. FIG. 6D represents a state of semiconductor structure 600 directly after disposing several channel layers in channel structure 610. It should be appreciated that channel layers in FIG. 6D can correspond with those described earlier in reference to FIG. 5 (e.g., memory film 337, a channel layer 338, core filling film 339, or the like).

In some embodiments, the fabrication method can comprise disposing a channel layers 620, 622, 624, 626, and/or 628 in channel structure 610. A material of channel layer 620 (e.g., a first channel layer) can be silicon oxide. A material of channel layer 622 (e.g., a second channel layer) can be silicon nitride. A material of channel layer 624 (e.g., a third channel layer) can be silicon nitride. A material of channel layer 626 (e.g., a polysilicon channel layer) can be polysilicon. A material of channel layer 628 (e.g., a fourth channel layer) can be silicon oxide. Channel layer 628 can be a structural core (e.g., core filling film 339 (FIG. 5)). The disposing of channel layers can be performed in an order such that channel layers 620, 624, and 628 are separated from one another (e.g., the first, third, and fourth channel layers; e.g., the silicon oxide channel layers). The disposing of the channel layers can be achieved, for example, using any of the material disposing techniques described earlier (e.g., CVD, PVD, or the like).

It was mentioned that, in some embodiments, a narrowed portion 630 can be formed as part of the etching process when carving out channel structure 610. During the disposing of the channel layers, narrowed portion 630 has the effect of obstructing material from completely filling part of channel structure 610. The result is that a void 632 is formed during the disposing of the channel layers. In order to prevent undesirable material from entering void 632 later on (e.g., during the removal of sacrificial layer 608), the fabrication method can comprise narrowing a portion of channel structure 610 based on the expanding of the exposed portion of the polysilicon layer. The narrowing here—at channel end structure 634—is separate from narrowed portion 630.

It was also mentioned that, in some embodiments, the etch process can be stopped after a partial etch of sacrificial structure 608. A consequence is that, during the disposing of channel materials, at least a portion of channel layer 620

(and possibly additional channel layers) may be disposed in the etched portion of sacrificial layer 608. This can be desirable for bringing the material of channel layer 626 (e.g., the polysilicon channel layer) closer to sacrificial layer 608 or even within the etched portion of sacrificial layer 608. When sacrificial layer 608 is later removed, the process of making electrical contact to channel layer 626 can be more reliable.

In some embodiments, the narrowed portion at channel end structure 634 can be used to obstruct access to void 632 by closing off access to the void based on at least the disposing of channel layers 622, 624, and 626 within channel structure 610 (e.g., at least a silicon oxide, silicon nitride, and polysilicon channel layers).

To appreciate the effects of the narrowed portion at channel end structure 634, it is instructive to consider a scenario in which the expansion of polysilicon layer 606 is skipped. In this scenario, void 632 can extend closer to sacrificial substrate 608. When sacrificial substrate 608 is removed via chemical-mechanical polishing, the upwardly extended void 632 can be opened and slurry from the chemical-mechanical polishing can fill void 632, reducing the quality of channel construction in the process.

After the disposing of materials within channel structure 610, in some embodiments, semiconductor structure 600 can be bonded to another structure that provides electrical connectivity to channel structure 610. For example, semiconductor structure 600 can be bonded to a CMOS structure. The side of semiconductor structure 600 that is bonded to the CMOS structure is not currently shown in FIG. 6A, 6B, 6C or 6D because sacrificial layer 608 is disposed opposite from the bonding interface of the semiconductor structure 600 and the CMOS structure. A reason for performing the bonding is to complete an electrical circuit using channel structure 610. The CMOS structure can comprise top select gate structures (e.g., TSG 334).

Figure 7:
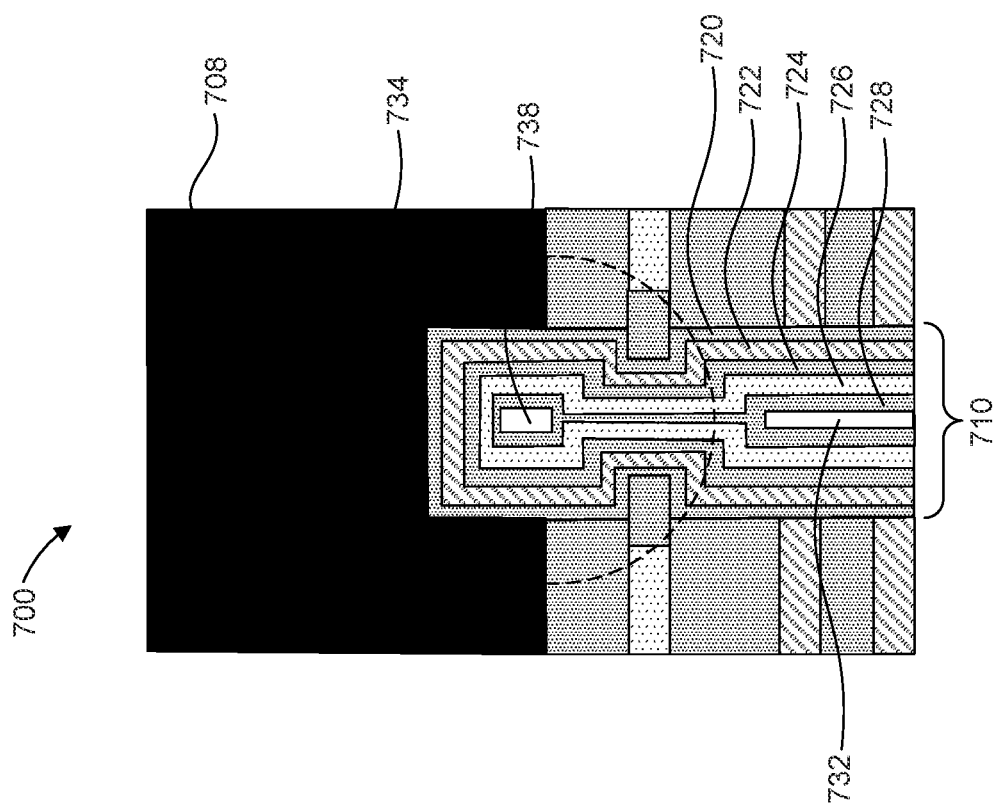
FIG. 7 illustrates a semiconductor structure after undergoing a fabrication method described in reference to FIGS. 6A, 6B, 6C, and 6D, according to some embodiments.

In some embodiments, the resulting channel end structure 634 need not be limited to the one shown in FIG. 6D. FIG. 7 shows a semiconductor structure 700 after undergoing the fabrication method described in reference to FIGS. 6A, 6B, 6C and 6D. In some embodiments, semiconductor structure 700 can comprise structures and functions similar to semiconductor structure 600 that were described in reference to FIGS. 6A, 6B, 6C and 6D. Therefore, unless otherwise noted, descriptions of elements of FIGS. 6A, 6B, 6C and 6D can also apply to corresponding elements of FIG. 7 (e.g., reference numbers sharing the two right-most numeric digits). Therefore, some descriptions of elements in FIG. 7 will not be reintroduced, particularly for similar elements that have already been described above in reference to FIGS. 6A, 6B, 6C and 6D.

In some embodiments, channel end structure 734 is different from channel end structure 634 (FIG. 6D) in that channel end structure 734 can comprise a bulge that extends into sacrificial layer 708. The bottleneck caused by expanded portion 716 causes the upper bulge to have a structure similar to that of the bulk of channel structure 710. That is, the upper bulge can also comprise channel layers 720, 722, 724, 726, and/or 728, as well as a void 738.

As explained previously, it is undesirable for contaminant material to enter void 732. However, void 738 poses no issues if it is intended that subsequent fabrication processes are to remove the upper bulge completely (but stop short of opening an access to void 732).

FIGS. 8A, 8B, 8C, and 8D illustrate a cross-section of a semiconductor structure 800 at various stages of fabrication, according to some embodiments. In some embodiments, semiconductor structure 800 can comprise structures and functions similar to semiconductor structures 600 and/or 700 that were described in reference to FIGS. 6A, 6B, 6C, 6D, and 7. Therefore, unless otherwise noted, descriptions of elements of FIGS. 6A, 6B, 6C, 6D, and 7 can also apply to corresponding elements of FIGS. 8A, 8B, 8C, and/or 8D (e.g., reference numbers sharing the two right-most numeric digits). Therefore, some descriptions of elements in FIGS. 8A, 8B, 8C, and 8D will not be reintroduced, particularly for similar elements that have already been described above in reference to FIGS. 6A, 6B, 6C, 6D, and 7.

Figure 8A:
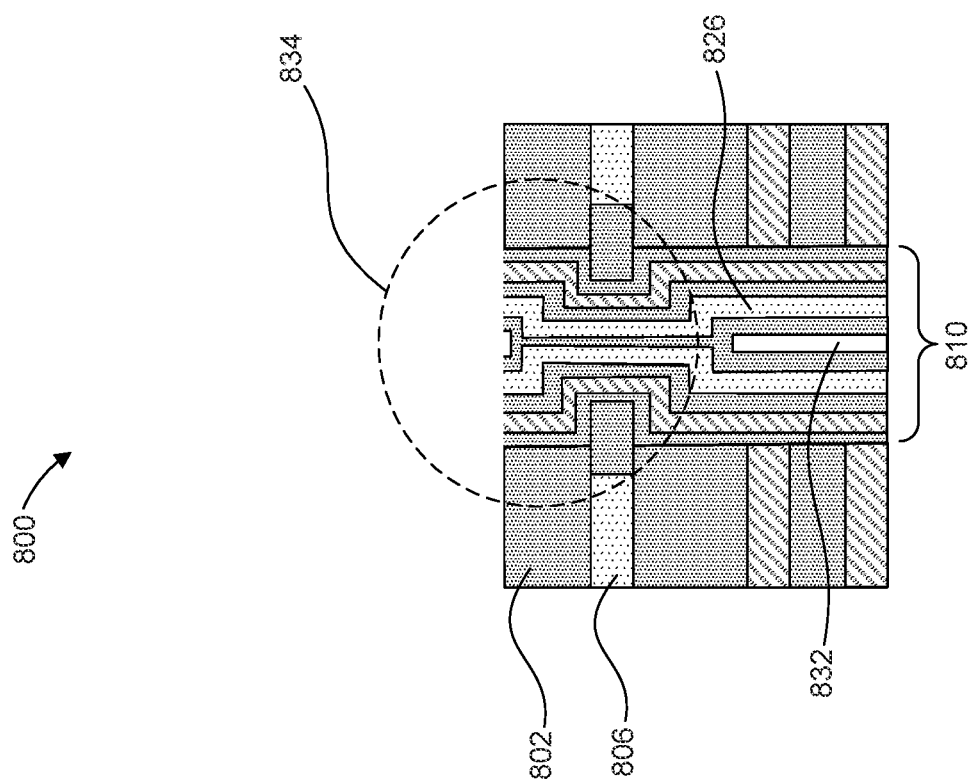
FIGS. 8A, 8B, 8C, and 8D illustrate a cross-section of a semiconductor structure at various stages of fabrication, according to some embodiments.

In some embodiments, the fabrication method can comprise removing a sacrificial layer from a semiconductor structure. FIG. 8A represents a state of semiconductor structure 800 directly after removing a sacrificial layer (e.g., sacrificial structure 708 (FIG. 7)). The removing of the sacrificial structure can comprise removing a portion of channel structure 810 disposed intersecting the sacrificial layer. In FIG. 8A, this corresponds to removing a portion of channel end structure 834. The removal of the sacrificial structure can be accomplished using, for example, a chemical-mechanical polishing process. Channel end structure 834 can comprise the narrowed portion based on oxidation of polysilicon layer 806 (as described previously in reference to FIGS. 6C and 6D). The narrowed portion serves to obstruct access to void 832. For example, the narrowed portion can prevent slurry created by chemical-mechanical polishing from entering void 832.

Figure 8B:
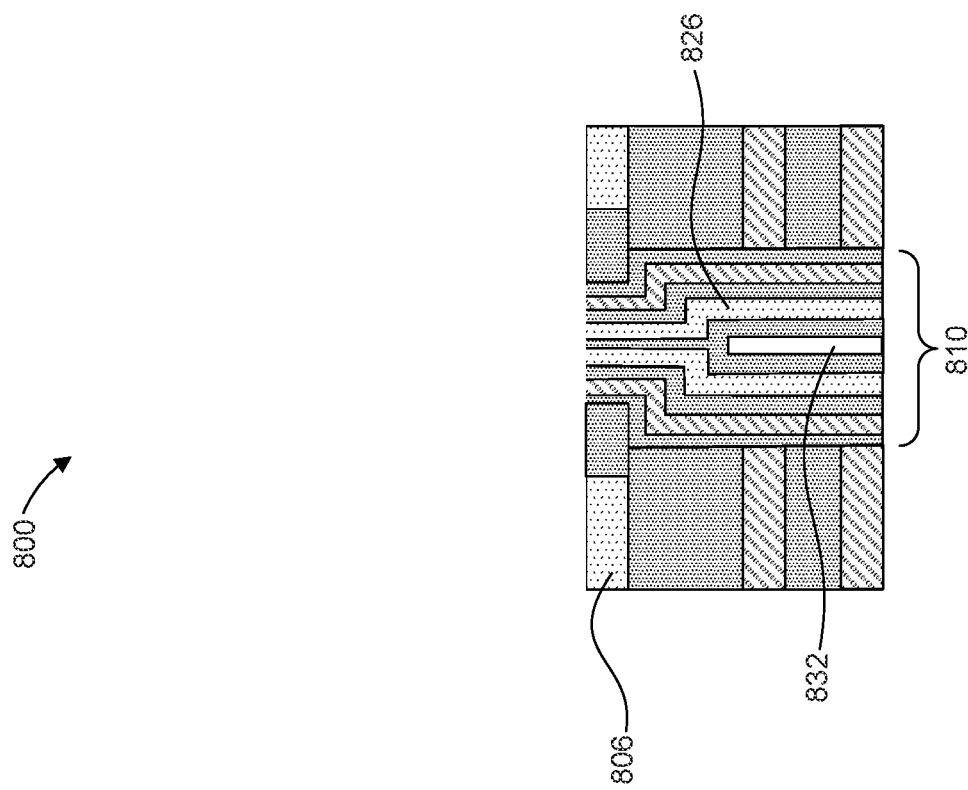

In some embodiments, the fabrication method can comprise removing another layer from semiconductor structure 800. FIG. 8B represents a state of semiconductor structure 800 directly after removing another layer in addition to the removal of the sacrificial layer. The removed layer in this scenario can be a silicon compound layer 802 (e.g., a silicon oxide layer, a first silicon compound layer). Silicon compound layer 802 can be removed using, for example, a chemical-mechanical polishing process. Here too, the narrowed portion at channel end structure 834 can prevent slurry created by chemical-mechanical polishing from entering void 832.

Figure 8C:
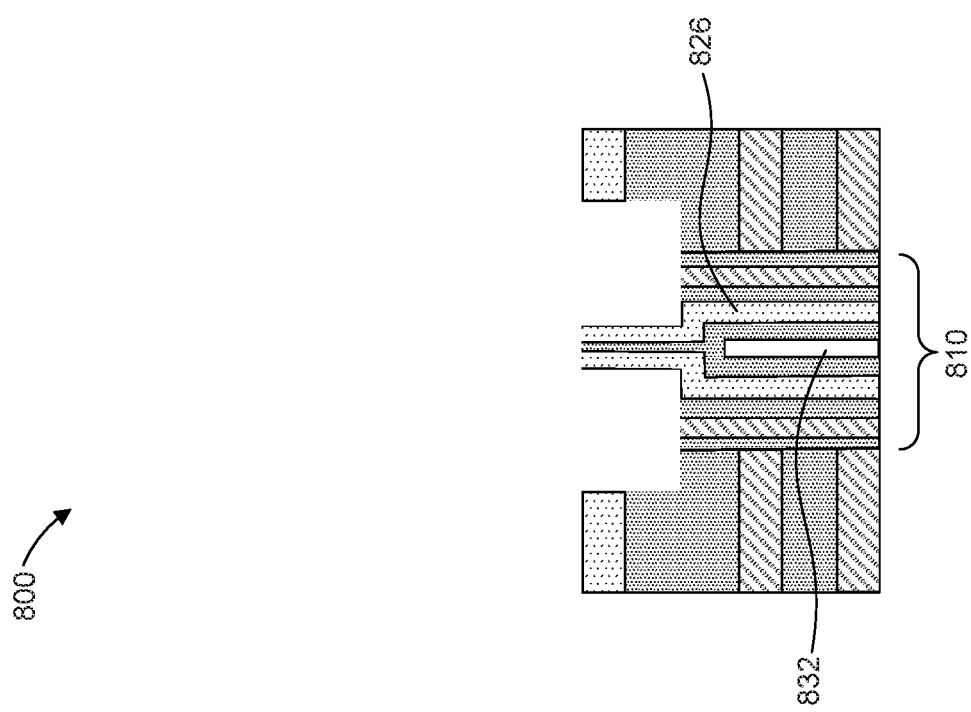

In some embodiments, the fabrication method can comprise etching portions of semiconductor structure 800. FIG. 8C represents a state of semiconductor structure 800 directly after an etching process. The etching process can be a selective etch to target silicon nitride and/or silicon oxide while keeping polysilicon intact (e.g., etching portions of the first and second silicon compounds disposed proximal to the narrowed portion of the channel structure). The etching process can be, for example, a gas plasma etch. FIG. 8C shows that some of the polysilicon channel layer 826 at the narrowed portion of channel structure 810 is exposed after the selective etch. The exposure of the polysilicon channel material allows electrical contact with channel structure 810.

Figure 8D:
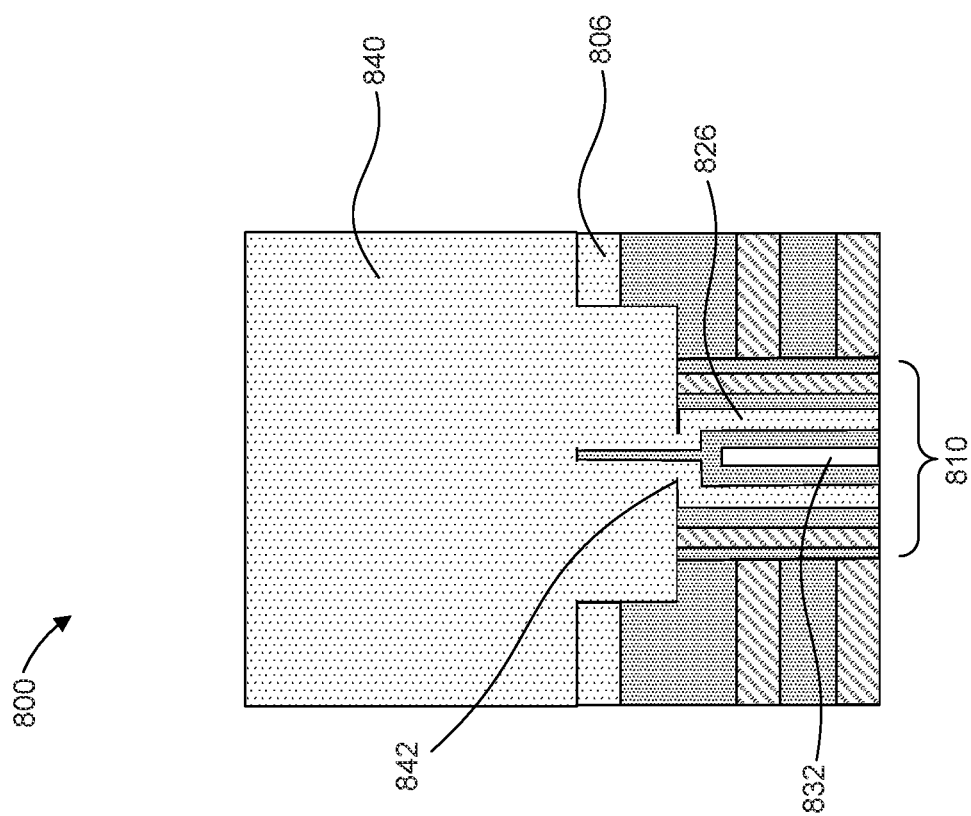

In some embodiments, the fabrication method can comprise disposing polysilicon material 840 on semiconductor structure 800. FIG. 8D represents a state of semiconductor structure 800 directly after disposing polysilicon material 840. It is shown that a polysilicon contact 842 has been made to a polysilicon structure of channel structure 810 that was exposed by the selective etch previously described in reference to FIG. 8C. The polysilicon contacts here can form bottom select gate(s) (BSG).

Figure 9:
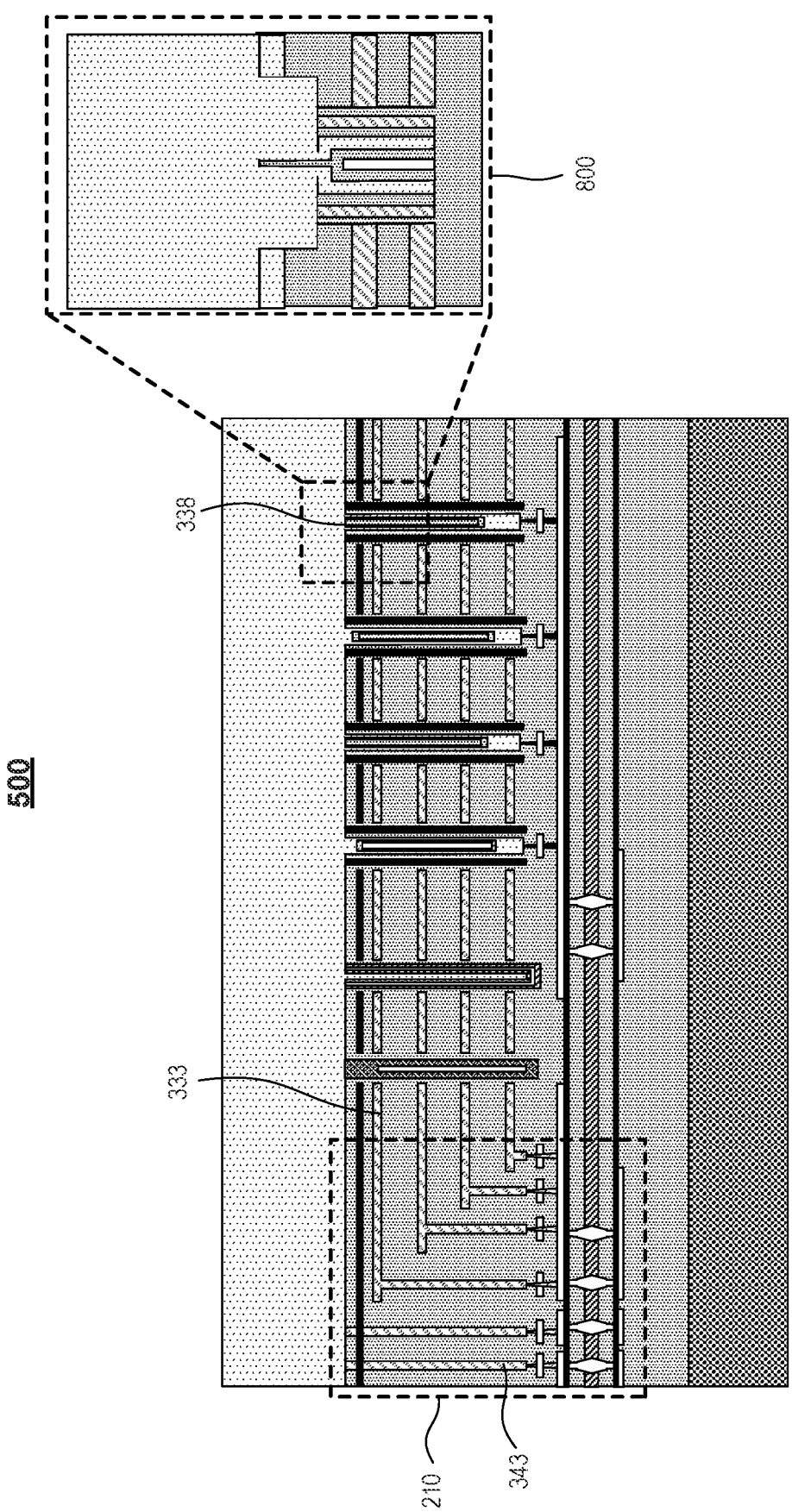
FIG. 9 illustrates a cross-sectional view of a portion of a 3D memory structure, in accordance with some embodiments.

FIG. 9 illustrates cross-sectional view of a 3D memory structure 500, according to some embodiments. In particular, FIG. 9 shows an implementation of fabrication methods described in reference to FIGS. 6A-6D, 7, and/or 8A-8D in the 3D memory structure 500 first introduced in FIG. 5. In some embodiments, the inset in FIG. 9 shows the finalized semiconductor structure 800 from FIG. 8D. For context, some structures are labeled for staircase region 210, interconnect lines 343, word lines 333, and channel 338 (to indicate correspondence between FIGS. 5 and 9). In this manner, the wet oxidation fabrication method may be used to produce 3D memory structure 500 with fewer errors related to slurry contaminating the channels during polishing.

In some embodiments, the fabrication method steps described herein can be used to fabricate a layered semiconductor structure. Based on the fabrication method steps, the layered semiconductor structure can comprise a polysilicon layer, a silicon oxide layer, a silicon nitride layer, and a channel structure. The channel structure can have a length that is disposed intersecting at least the polysilicon, silicon oxide, and silicon nitride layers. The channel structure can comprise a wide portion having a width defined perpendicular to the length of the channel. The wide portion is disposed intersecting at least the silicon nitride layer (see e.g., width 614 (FIGS. 6B and 6C). The channel structure can further comprise a narrow portion having a width defined perpendicular to the length of the channel. The narrow portion is disposed intersecting at least the polysilicon layer and the width of the narrow portion is smaller than the width of the wide portion (see e.g., width 612' (FIG. 6C)).

The method steps in embodiments disclosed herein can be performed in any conceivable order and it is not required that all steps be performed.

In summary, the present disclosure provides a fabrication method to produce a semiconductor structure with increased reliability for use in NAND memory devices. The method can include forming a semiconductor structure that includes a first layer, a second layer disposed on the first layer, and a third layer. The method can also include forming a channel structure. The forming of the channel structure can include etching the first layer, the second layer, and the third layer to form an opening through a surface of the semiconductor structure. A portion of the third layer can be exposed at the opening. The forming of the channel structure can also include oxidizing the exposed portion of the third layer to form silicon oxide to expand the exposed portion of the third layer.

The present disclosure also provides a further fabrication method to produce a semiconductor structure with increased reliability for use in NAND memory devices. The method can include fabricating the semiconductor structure to include a sacrificial layer, a first layer, a second layer disposed on the first layer, a third layer, and a channel structure disposed intersecting at least the first, second, third, and sacrificial layers. The channel structure can include a void and a narrowed portion. The method can also include removing the sacrificial layer. The removing of the sacrificial structure can include removing a portion of the channel structure disposed intersecting the sacrificial layer. The method can also include removing the first layer to expose the third layer and the narrowed portion of the channel structure, wherein material produced by the removing of the sacrificial layer is prevented from entering the void of the channel structure based on the narrowed portion obstructing access to the void.

The present disclosure further provides a layered semiconductor structure having increased reliability for use in NAND memory devices. The semiconductor can include a polysilicon layer, a silicon oxide layer, a silicon nitride layer, and a channel structure. The channel structure can have a length that is disposed intersecting at least the polysilicon, silicon oxide, and silicon nitride layers. The channel structure can include a wide portion having a width defined perpendicular to the length of the channel. The wide portion can be disposed intersecting at least the silicon nitride layer. The channel structure can also include a narrow portion having a width defined perpendicular to the length of the channel. The narrow portion can be disposed intersecting at least the polysilicon layer. The width of the narrow portion can be smaller than the width of the wide portion.

The present disclosure further provides a NAND flash memory device having a layered semiconductor structure that increases reliability. The NAND flash memory device can include a semiconductor structure. The semiconductor can include a polysilicon layer, a silicon oxide layer, a silicon nitride layer, and a channel structure. The channel structure can have a length that is disposed intersecting at least the polysilicon, silicon oxide, and silicon nitride layers. The channel structure can include a wide portion having a width defined perpendicular to the length of the channel. The wide portion can be disposed intersecting at least the silicon nitride layer. The channel structure can also include a narrow portion having a width defined perpendicular to the length of the channel. The narrow portion can be disposed intersecting at least the polysilicon layer. The width of the narrow portion can be smaller than the width of the wide portion.

The present disclosure further provides a memory system that has a layered semiconductor structure that increases reliability. The memory system can include a NAND flash memory device. The NAND flash memory device can include a semiconductor structure. The semiconductor can include a polysilicon layer, a silicon oxide layer, a silicon nitride layer, and a channel structure. The channel structure can have a length that is disposed intersecting at least the polysilicon, silicon oxide, and silicon nitride layers. The channel structure can include a wide portion having a width defined perpendicular to the length of the channel. The wide portion can be disposed intersecting at least the silicon nitride layer. The channel structure can also include a narrow portion having a width defined perpendicular to the length of the channel. The narrow portion can be disposed intersecting at least the polysilicon layer. The width of the narrow portion can be smaller than the width of the wide portion.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

Other aspects of the present disclosure are set-out as in the following numbered clauses.

1. A method comprising:
   forming a semiconductor structure comprising a first layer, a second layer disposed on the first layer, and a third layer disposed on the second layer;
   forming a channel structure, comprising:
      etching the first layer, the second layer, and the third layer to form an opening through a surface of the semiconductor structure, wherein a portion of the third layer is exposed at the opening; and
      oxidizing the exposed portion of the third layer to form silicon oxide to expand the exposed portion of the third layer.
2. The method of clause 1, wherein the oxidizing comprises using a wet oxidation process.
3. The method of clause 1, wherein the expanding of the exposed portion of the polysilicon layer narrows a portion of the opening.
4. The method of clause 1, further comprising:
   disposing a first channel layer at the opening;
   disposing a second channel layer at the opening and on the first channel layer; and disposing a third channel layer at the opening and on the second channel layer.
5. The method of clause 4, wherein:
   the expanding of the exposed portion of the third layer narrows a portion of the opening; and the disposing of the first, second, or third channel layers obstructs the narrowed portion of the channel.
6. The method of clause 4, further comprising disposing fourth and fifth channel layers at the channel structure, wherein.
7. The method of clause 1, further comprising forming a channel end structure, comprising:
   disposing a first channel layer at the opening;
   disposing a second channel layer at the opening and on the first channel layer; and
   disposing a third channel layer at the opening and on the second channel layer,
   wherein the channel end structure comprises a bottleneck cross-section based on the expanded exposed portion of the third layer.
8. The method of clause 1, wherein the forming of the semiconductor structure comprises forming a layer of silicon oxide for the first layer.
9. The method of clause 1, wherein the forming of the semiconductor structure comprises forming a layer of silicon nitride for the second layer.
10. The method of clause 1, wherein the oxidizing comprises performing a wet oxidation process using gasses having a temperature greater than approximately 600 degrees Celsius and less than approximately 800 degrees Celsius.
11. The method of clause 1, wherein the oxidizing comprises exposing the exposed portion of the polysilicon layer to hydrogen gas and oxygen gas.
12. The method of clause 11, wherein a ratio of the hydrogen gas to the oxygen gas is greater than approximately 0.14 and less than approximately 7.00.
13. The method of clause 11, wherein the oxidizing further comprises performing the exposing of the exposed portion of the polysilicon layer to the hydrogen and oxygen gasses for a duration greater than approximately 0.5 hours and less than approximately 12.0 hours.
14. The method of clause 11, wherein the oxidizing comprises exposing the exposed portion of the third layer to nitrogen gas.
15. The method of clause 1, wherein:
   the semiconductor structure comprises a sacrificial layer affixed to at least the first layer; the etching further comprises etching the sacrificial layer.
16. The method of clause 15, further comprising disposing a first channel layer at the opening wherein a portion of the first channel layer is disposed in an etched portion of the sacrificial layer.
17. The method of clause 15, further comprising bonding the semiconductor structure to a CMOS structure, wherein the sacrificial layer is disposed opposite from a bonding interface of the semiconductor structure and the CMOS structure.
18. A method of fabricating a semiconductor structure comprising a sacrificial layer, a first layer, a second layer c, a third layer, and a channel structure disposed intersecting at least the first, second, third, and sacrificial layers and comprising a void and a narrowed portion, the method comprising:
   removing the sacrificial layer, wherein the removing of the sacrificial structure comprises removing a portion of the channel structure disposed intersecting the sacrificial layer;
   removing the first layer to expose the third layer and the narrowed portion of the channel structure, wherein material produced by the removing of the sacrificial layer is prevented from entering the void of the channel structure based on the narrowed portion obstructing access to the void.
19. The method of clause 18, further comprising etching portions of the first and second layers disposed proximal to narrowed portion of the channel structure.
20. The method of clause 19, further comprising disposing polysilicon on the semiconductor structure to form a contact to a polysilicon structure of the channel structure.
21. The method of clause 18, wherein the removing of the sacrificial layer further comprises using a chemical mechanical polishing process.
22. The method of clause 18, wherein the removing of the first layer comprises using a chemical mechanical polishing process.
23. A semiconductor structure comprising:
   a polysilicon layer;
   a silicon oxide layer;
   a silicon nitride layer; and
   a channel structure having a length that is disposed intersecting at least the polysilicon, silicon oxide, and silicon nitride layers, the channel structure comprising:
      a wide portion having a width defined perpendicular to the length of the channel, wherein the wide portion is disposed intersecting at least the silicon nitride layer; and
      a narrow portion having a width defined perpendicular to the length of the channel, wherein the narrow portion is disposed intersecting at least the polysilicon layer and the width of the narrow portion is smaller than the width of the wide portion.
24. A NAND flash memory device comprising:
   semiconductor structure comprising:
      a polysilicon layer;

a silicon oxide layer;
a silicon nitride layer; and
a channel structure having a length that is disposed to intersect at least the polysilicon, silicon oxide, and silicon nitride layers, the channel structure comprising:
  a wide portion having a width defined perpendicular to the length of the channel, wherein the wide portion is disposed intersecting at least the silicon nitride layer; and
  a narrow portion having a width defined perpendicular to the length of the channel, wherein the narrow portion is disposed intersecting at least the polysilicon layer and the width of the narrow portion is smaller than the width of the wide portion.

25. A memory system comprising:
a NAND flash memory device comprising:
  semiconductor structure comprising:
    a polysilicon layer;
    a silicon oxide layer;
    a silicon nitride layer; and
    a channel structure having a length that is disposed to intersect at least the polysilicon, silicon oxide, and silicon nitride layers, the channel structure comprising:
      a wide portion having a width defined perpendicular to the length of the channel, wherein the wide portion is disposed intersecting at least the silicon nitride layer; and
      a narrow portion having a width defined perpendicular to the length of the channel, wherein the narrow portion is disposed intersecting at least the polysilicon layer and the width of the narrow portion is smaller than the width of the wide portion.

The breadth and scope of the present disclosure should not be limited by any of the above-described exemplary embodiments, but should be defined only in accordance with the following claims and their equivalents.

What is claimed is:

1. A method comprising:
forming a semiconductor structure comprising a sacrificial layer, a first layer, a second layer disposed on the first layer, and a third layer disposed on the second layer;
forming a channel structure, wherein forming the channel structure further comprises:
  etching the first layer, the second layer, and the third layer to form an opening through a surface of the semiconductor structure, wherein a portion of the third layer is exposed at the opening; and
  oxidizing the exposed portion of the third layer to form silicon oxide to expand the exposed portion of the third layer, wherein the exposed portion includes:
    a wide portion having a width defined perpendicular to a length of the channel structure, wherein the wide portion is disposed intersecting at least the second layer; and
    a narrow portion having a width defined perpendicular to the length of the channel structure, wherein the narrow portion is disposed intersecting at least the third layer and the width of the narrow portion is smaller than the width of the wide portion;
removing the sacrificial layer and a portion of the channel structure to form a channel end structure that comprises a bottleneck cross-section based on the expanded exposed portion of the third layer; and
disposing a polysilicon material on the channel end structure to form a contact to the third layer of the channel structure.

2. The method of claim 1, wherein the oxidizing comprises using a wet oxidation process.

3. The method of claim 1, wherein the expanding of the exposed portion of the third layer narrows a portion of the opening.

4. The method of claim 1, further comprising:
disposing a first channel layer at the opening;
disposing a second channel layer at the opening and on the first channel layer; and
disposing a third channel layer at the opening and on the second channel layer.

5. The method of claim 4, wherein:
the expanding of the exposed portion of the third layer narrows a portion of the opening; and
the disposing of the first, second, or third channel layers obstructs the narrowed portion of the opening.

6. The method of claim 4, further comprising disposing fourth and fifth channel layers at the opening of the channel structure.

7. The method of claim 1, wherein the forming of the semiconductor structure comprises forming a layer of silicon oxide for the first layer.

8. The method of claim 1, wherein the forming of the semiconductor structure comprises forming a layer of silicon nitride for the second layer.

9. The method of claim 1, wherein the oxidizing comprises performing a wet oxidation process using gasses having a temperature greater than approximately 600 degrees Celsius and less than approximately 800 degrees Celsius.

10. The method of claim 1, wherein the oxidizing comprises exposing the exposed portion of the third layer to hydrogen gas and oxygen gas.

11. The method of claim 10, wherein a ratio of the hydrogen gas to the oxygen gas is greater than approximately 0.14 and less than approximately 7.00.

12. The method of claim 10, wherein the oxidizing comprises exposing the exposed portion of the third layer to nitrogen gas.

13. The method of claim 1, wherein the semiconductor structure comprises the sacrificial layer affixed to at least the first layer.

14. The method of claim 13, further comprising disposing a first channel layer at the opening wherein a portion of the first channel layer is disposed in an etched portion of the sacrificial layer.

15. A method of fabricating a semiconductor structure comprising a sacrificial layer, a first layer, a second layer, a third layer, and a channel structure disposed intersecting at least the first, second, and third layers and comprising a void and a narrowed portion, the method comprising:
removing the sacrificial layer, wherein the removing of the sacrificial layer comprises removing a portion of the channel structure disposed intersecting the sacrificial layer to form a channel end structure that comprises a bottleneck cross-section;
removing the first layer to expose the third layer and the narrowed portion of the channel structure, wherein the narrowed portion has a width defined perpendicular to a length of the channel structure, the narrowed portion is disposed intersecting at least the third layer, and the width of the narrowed portion is smaller than a width of a wide portion having a width defined perpendicular to the length of the channel structure, wherein the wide portion is disposed intersecting at least the second layer, and wherein material produced by the removing of the sacrificial layer is prevented from entering the void of the channel structure based on the narrowed portion obstructing access to the void; and disposing a polysilicon material on the channel end structure to form a contact to a polysilicon structure of the channel structure.

16. The method of claim 15, further comprising etching portions of the first and second layers disposed proximal to the narrowed portion of the channel structure.

17. The method of claim 15, wherein the removing of the sacrificial layer further comprises using a chemical mechanical polishing process.

* * * * *